(12) United States Patent
Hübner (10) Patent No.: US 11,793,080 B2
(45) Date of Patent: Oct. 17, 2023

(54) ULTRASONIC ACTUATOR, AND MOTOR HAVING SUCH AN ULTRASONIC ACTUATOR

(71) Applicant: Physik Instrumente (PI) GmbH & Co. KG, Karlsruhe (DE)

(72) Inventor: Reinhard Hübner, Waldbronn (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 47 days.

(21) Appl. No.: 17/624,710

(22) PCT Filed: Jul. 3, 2020

(86) PCT No.: PCT/DE2020/100586
§ 371 (c)(1),
(2) Date: Jan. 4, 2022

(87) PCT Pub. No.: WO2021/004583
PCT Pub. Date: Jan. 14, 2021

(65) Prior Publication Data
US 2022/0254983 A1    Aug. 11, 2022

(30) Foreign Application Priority Data

Jul. 5, 2019 (DE) ..................... 10 2019 118 198.4

(51) Int. Cl.
*H02N 2/00* (2006.01)
*H10N 30/20* (2023.01)
*H02N 2/02* (2006.01)

(52) U.S. Cl.
CPC ......... *H10N 30/206* (2023.02); *H02N 2/0025* (2013.01); *H02N 2/0055* (2013.01); *H02N 2/026* (2013.01)

(58) Field of Classification Search
CPC .. H10N 30/206; H02N 2/0025; H02N 2/0055; H02N 2/026; H02N 2/001; H02N 2/06
See application file for complete search history.

(56) References Cited

U.S. PATENT DOCUMENTS

| 5,665,918 A | 9/1997 | Takano et al. |
| 5,672,930 A | 9/1997 | Narisawa et al. |

(Continued)

FOREIGN PATENT DOCUMENTS

| CN | 105027417 A | 11/2015 |
| EP | 2153476 B1 | 8/2011 |

(Continued)

OTHER PUBLICATIONS

International Search Report (PCT/ISA/210) with translation and Written Opinion (PCT/ISA/237) dated Oct. 30, 2020, by the European Patent Office as the International Searching Authority for International Application No. PCT/DE2020/100586.

(Continued)

*Primary Examiner* — Emily P Pham
(74) *Attorney, Agent, or Firm* — BUCHANAN INGERSOLL & ROONEY PC (57) ABSTRACT

The disclosure relates to an ultrasonic actuator formed of a plate having a base, a cover surface which is geometrically similar to the base, and a lateral surface which interconnects the base and the cover surface, wherein the plate includes an electromagnetic material. Electrodes for inciting periodic deformations of the plate are arranged on the base of the plate and on the cover surface of the plate opposite the base. The base includes at least two faces which are arranged in parallel with one another and form contact portions of the lateral surface, and the two faces of the base arranged in parallel with one another, together with connecting lines which interconnect the respective end points of the faces arranged in parallel, form a parallelogram inscribed in the (Continued)

base, in which parallelogram an angle different from 90° is enclosed between adjacent faces. A motor having such an ultrasonic actuator is also disclosed.

16 Claims, 5 Drawing Sheets

(56) References Cited

U.S. PATENT DOCUMENTS

| | | | |
|---|---|---|---|
| 6,765,335 | B2 | 7/2004 | Wischnewskiy |
| 8,344,592 | B2 | 1/2013 | Wischnewskly et al. |
| 8,482,185 | B2 * | 7/2013 | Wischnewskij ......... G02B 7/10 310/323.01 |
| 9,246,413 | B2 * | 1/2016 | Masuda ................. H02N 2/001 |
| 9,991,823 | B2 | 6/2018 | Hübner |
| 2011/0050035 | A1 | 3/2011 | Wischnewskiy et al. |
| 2011/0175489 | A1 | 7/2011 | Wischnewskij et al. |
| 2012/0228994 | A1 | 9/2012 | Wischnewskiy et al. |
| 2016/0036352 | A1 | 2/2016 | Hübner |
| 2016/0049578 | A1 | 2/2016 | Miwa et al. |

FOREIGN PATENT DOCUMENTS

| | | |
|---|---|---|
| EP | 3499593 A1 | 6/2019 |
| JP | 2011522506 A | 7/2011 |
| JP | 5501254 B2 | 3/2014 |
| WO | 2014181801 A1 | 11/2014 |

OTHER PUBLICATIONS

Manabu Aoyagi et al., "Ultrasonic Motors Using Longitudinal and Bending Multimode Vibrators with Mode Coupling by Externally Additional Asymmetry or Internal Nonlinearity", Japanese Journal of Applied Physics, Sep. 1, 1992, vol. 31, No. 9B, pp. 3077-3080.

Office Action (Notice of Grounds of Rejection) dated Apr. 25, 2023, by the Japanese Patent Office in corresponding Japanese Patent Application No. 2022-500141, and an English Translation of the Office Action. (10 pages).

Notification of the First Office Action dated Jul. 13, 2023, by the Chinese Patent Office in corresponding Chinese Patent Application No. 202080049072.9, and an English Translation of the Office Action. (25 pages).

* cited by examiner

Fig. 6

ULTRASONIC ACTUATOR, AND MOTOR HAVING SUCH AN ULTRASONIC ACTUATOR

The invention relates to an ultrasonic actuator in the form of a plate having a base, a cover surface geometrically similar to the base, and a side or lateral surface interconnecting the base and the cover surface, wherein the plate has an electromechanical material and electrodes are arranged on the base thereof and on the cover surface thereof opposite to the base for exciting periodic deformations of the plate, and the base has at least two sides arranged parallel to one another, which define contact sections of the side surface, and the two sides of the base surface arranged parallel to one another, together with connecting lines that interconnect the respective end points of the sides arranged parallel to one another, form a parallelogram inscribed in the base, according to the generic term of claim 1. The invention further relates to a motor having such an ultrasonic actuator forming an ultrasonic motor.

In this context, the term "electromechanical material" used above and also in the following is to be understood as a material that performs a mechanical deformation upon applying an electric voltage and generating a corresponding electric field. In particular, this includes materials with piezoelectric properties, such as piezoceramic materials, but also, for example, materials with electrostatic properties.

Such ultrasonic actuators or the ultrasonic motors having incorporated them may be used in miniaturized, inexpensive devices with low energy consumption, such as miniature cameras, lenses of cell phones or smartphones, miniature storage devices and similar devices, where small dimensions, high positioning accuracy and low energy consumption by the drive are required.

Ultrasonic actuators for ultrasonic motors are known from U.S. Pat. Nos. 5,672,930 and 5,665,918, which are designed as complex composite vibrators consisting of a resonant body, on which piezoelectric excitation plates are bonded. The disadvantage of these actuators is that they have a relatively complicated structure and are costly to manufacture. Therefore, they are ruled out as an inexpensive mass-produced product for use in miniaturized devices.

Furthermore, from document U.S. Pat. No. 6,765,335 B2 an there is known an ultrasonic actuator for an ultrasonic motor, in which the resonant body is formed as a piezoelectric plate with a rectangular shape. This ultrasonic actuator is characterized by a simple design and an easily controllable manufacturing technology, which is why it appears to be suitable as a low-cost mass product. The disadvantage of this ultrasonic actuator, however, is to be seen in the fact that a relatively high electric power is required for its operation, resulting in increased energy consumption. Therefore, such an ultrasonic actuator is also ruled out for use in miniature devices with correspondingly required low energy consumption.

The ultrasonic actuator known from EP 2 153 476 B1 may indeed solve the problems described above, in that this ultrasonic actuator is of a comparatively simple design and at the same time has low electrical power consumption with high operational stability or safety. Nevertheless, with the ultrasonic actuator disclosed in EP 2 153 476 B1, a realization of a corresponding ultrasonic motor is associated with higher expenditure, in particular with regard to the structure of the armature of such a motor. In this case, it turns out to be comparatively costly to realize the constant contact force of the rotor against the ultrasonic actuator over the entire travel distance of the armature, which is necessary for a permanently reliable operation.

It is therefore the object of the invention to provide an ultrasonic actuator which, in addition to a simple design and low electrical energy consumption, also has the property of allows realization of a simply constructed and yet permanently reliable motor, which may be manufactured and assembled in an easy manner and, in particular, in large quantities and which has good scalability or miniaturizability.

This object is solved by an ultrasonic actuator of the type described at the beginning, in which, with respect to the parallelogram inscribed in the base, an angle deviating from 90° is included in each case between abutting or adjacent or neighboring sides. In other words, specifically, the inscribed parallelogram is not a right-angled parallelogram.

Due to the specific shape of the inscribed parallelogram, the respective sides arranged parallel to each other cannot be brought into complete overlap by shifting along their respective side normals, as would be the case with a right-angled parallelogram. In other words, the normals, which each pass through the center of the corresponding side, do not intersect, but are arranged parallel and offset to each other. In this case, if forces act along the normals with respect to the contact portions or contact surfaces formed by the corresponding sides of the lateral surface—for example due to a pressing of running surfaces of an armature to be moved with respect to the ultrasonic actuator against the contact portions or contact surfaces of the ultrasonic actuator—a torque results that tries to rotate the ultrasonic actuator. The corresponding counter-torque acting on the running surfaces may be used to generate a defined contact force of a guide part or its guide portions connected to or integral with the armature against guide elements of a guide device. In this way, the mechanical preload on the ultrasonic actuator necessary for optimized operation of the corresponding ultrasonic motor and the above-described contact pressure of guide portions against guide elements of a guide device, and preferably a sliding guide, may be realized simultaneously via the running surfaces, which are, for example, an integral part of the armature.

In this regard, it may be advantageous that the larger interior angles of the inscribed parallelogram have values between 93° and 105° and preferably between 95° and 99°. Accordingly, the smaller interior angles of the inscribed parallelogram have values between 87° and 75° and preferably values between 85° and 81°. With such a geometry of the inscribed parallelogram, in the case of a corresponding ultrasonic motor in which running surfaces of an armature are pressed against the contact portions of the ultrasonic actuator, a counter-torque that is advantageous for permanent and reliable operation of the ultrasonic motor may be applied to a guide device connected to the armature, whereas with smaller values for the larger interior angles, a torque or counter-torque that is sufficient for this purpose may no longer be achieved. At larger values of the larger interior angle, a less stable as well as less defined oscillation of the ultrasonic actuator results, thereby leading to a lower positioning accuracy and to a more irregular drive with a corresponding ultrasonic motor.

It may be advantageous that the base or the cover surface arranged parallel thereto and geometrically similar and preferably identically shaped is octagonal and is adjoined on both sides of the inscribed parallelogram in each case by a trapezoid and preferably an isosceles trapezoid, and the base of each trapezoid coincides with the respective longer side of the inscribed parallelogram. The resulting prismatic shape of the ultrasonic actuator enables a particularly effective excitation of deformations usable for driving an armature at comparatively low material cost.

In the case of an isosceles trapezoid, it may be advantageous that the length of a diagonal of a trapezoid is substantially identical to the distance between the side or base opposite the base of that trapezoid and the base of the other trapezoid. These geometric ratios result in an ultrasonic actuator, whose width is less than twice its height, and which thus has a comparatively small footprint, thereby requiring less material. In addition, such geometric ratios of the ultrasonic actuator result in three dimensions being superimposed on the vibration mode used. One dimension of the vibration mode may be suppressed by external influences without the used vibration mode disappearing. This increases the overall robustness of the motor against external influences and the mechanical environment of the actuator.

The invention further relates to a motor having an ultrasonic actuator described above and including a mounting device for fixedly mounting the ultrasonic actuator and an armature movable relative to the ultrasonic actuator and in direct or indirect frictional contact therewith, wherein the mounting device includes at least four retaining portions contacting the ultrasonic actuator at different areas, of which two retaining portions are mechanically stiff and form stiff retaining portions, and of which two retaining portions have resilient properties and form resilient retaining portions.

In this case, it may be advantageous that the stiff retaining portions and the resilient retaining portions are each arranged obliquely opposite each other.

In addition, it may be advantageous that the mounting device includes two further retaining portions each contacting an area of the side surface of the ultrasonic actuator located between the area of the side surface contacted by the respective rigid retaining portion and the respective resilient retaining portion.

In one embodiment, the motor may be configured such that the armature comprises two elongated and parallel running surfaces that directly or indirectly contact the ultrasonic actuator at the contact portions and clamp the latter between them. As a result of the clamping forces introduced via the contact portions, a torque acts on the ultrasonic actuator due to its specific geometric shape, by means of which the latter is pressed with the respective portion of the lateral surface against the respective rigid retaining portion of the mounting element.

It may be advantageous in this case that the armature includes a guide part with at least two guide portions spaced apart from one another, the guide portions being in engagement with guide elements or guide portions enabling a sliding movement. In the case of guide elements, these are present separately, while in the case of guide portions, these are in a preferred manner an integral part of the mounting device. The guide portions are preferably integrally formed with the guide part, and the guide part is preferably integrally formed with the armature.

The following is a description of an embodiment of the ultrasonic actuator according to the invention and a corresponding motor with respect to the corresponding figures, wherein the same reference signs refer to the same parts of the different figures.

Figure 1:
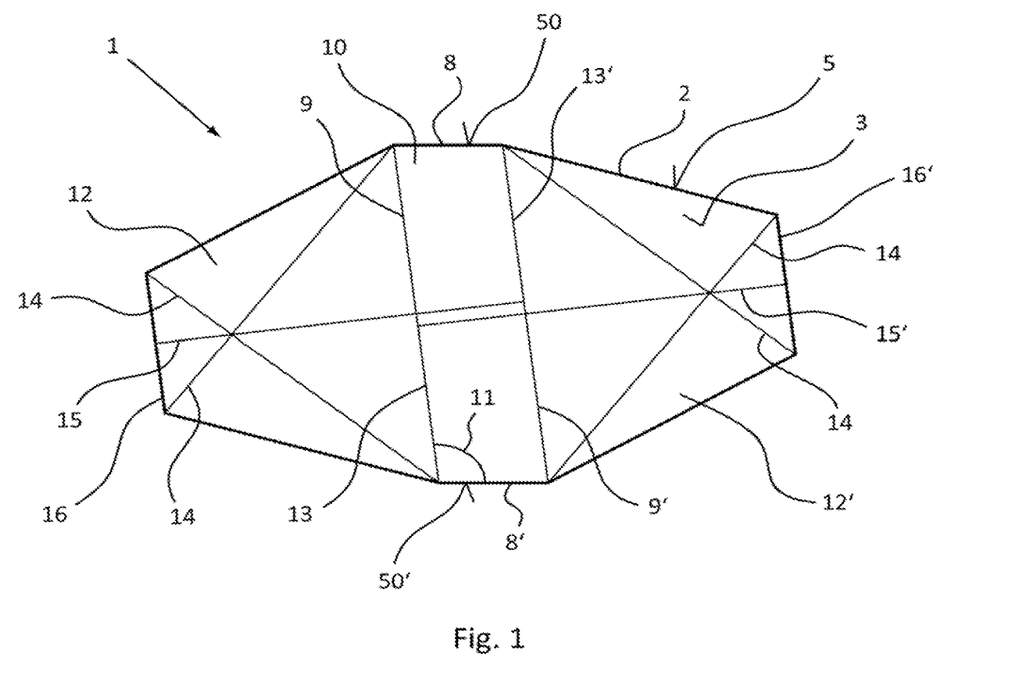
FIG. 1: Top view of the base of an ultrasonic actuator according to the invention.

FIG. 1 shows in a plan view the base 3 of an ultrasonic actuator 1 according to the invention, which has the shape of an octagonal plate 2 or an octagonal prism, so that the cover surface opposite the base 3 and not to be seen in FIG. 1 has a shape identical to the base 3, and the side surface 5 connecting the base 3 and the cover surface to each other is arranged both perpendicular to the base 3 and perpendicular to the cover surface. Embodiments of the ultrasonic actuator 1 are also conceivable, however, in which the shape of the base 3 and the cover surface differ from each other with geometric similarity, so that the side surface 5 is not arranged perpendicular to the base 3 or the cover surface.

The octagonal shape of the base 3 and the corresponding prismatic shape of the ultrasonic actuator results in a side surface 5 with eight sections distinguishable from each other, wherein the sides 8 and 8' form contact portions 50 and 50' of the side surface 5. The contact portions 50 and 50' are provided for direct or indirect contact with an element of a corresponding ultrasonic motor to be driven by the ultrasonic actuator.

Two of the shorter sides of the base 3, namely the sides 8 and 8', are arranged parallel to and spaced apart from each other, and by moving the sides along their respective side normals, the sides 8 and 8' cannot be brought into complete overlap. In other words, the sides 8 and 8', as seen in their direction of extension, are arranged offset from each other. In a corresponding manner, two connecting lines 9 and 9', which interconnect the respective corresponding end points of the sides 8 and 8', result in a parallelogram 10 inscribed in the base 3, which parallelogram is not rectangular or in which adjacent or abutting sides enclose an angle between them, which deviates from 90°. In this case, the two larger angles 11 of the parallelogram are 97°, resulting in smaller angles of the parallelogram of 83°.

On both sides of the inscribed parallelogram 10, with respect to the base 3 a respective isosceles trapezoid 12, 12' adjoins, whose respective base 13, 13' coincides with the respective longer side of the inscribed parallelogram 10, which corresponds to the respective connecting line 9, 9'. The length of each diagonal 14 of a trapezoid 12, 12' is substantially identical to the shortest distance 15 between the side 16, 16' opposite the base 13, 13' of this trapezoid and the base 13, 13' of the respective other trapezoid 12, 12'. In the present case, the sides 16, 16', which also represent shorter sides of the shape of the base 3, are arranged in parallel to the base 13, 13' of the respective trapezoid 12, 12'.

Due to the fact that the inscribed parallelogram 10 deviates from a right-angled parallelogram, the side normals extending from the center point of the side 16, 16' of the respective right-angled trapezoid opposite the base 13, 13' and parallel thereto do not intersect, but extend parallel to and spaced apart from each other.

Figure 2A:
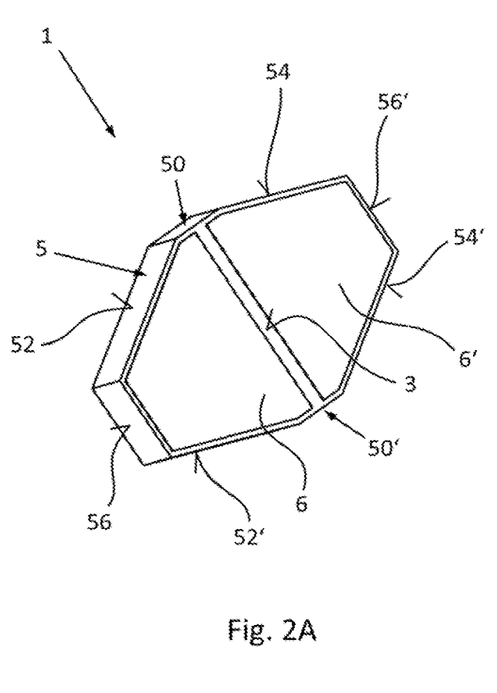
FIGS. 2A, 2B: Different perspective views of the ultrasonic actuator according to FIG. 1.

FIG. 2A shows the ultrasonic actuator 1 according to FIG. 1 in a perspective view mainly directed at the base 3. Two identically formed electrodes 6 and 6' arranged in mirror image to each other are located on the octagonal base 3 and are separated from each other by an intervening gap, thereby being electrically insulated from each other. In addition to the contact portions 50 and 50' formed by the sides 8 and 8' of the base 3, the longer sides of the base 3 form the portions 52, 52', 54 and 54' of the side surface 5, while the two remaining shorter sides 16 and 16' of the base 3 form or define the portions 56 and 56' of the side surface 5.

Figure 2B:
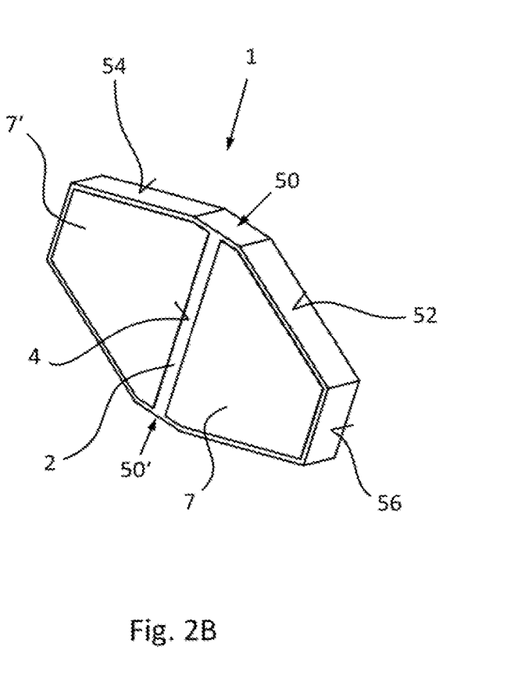

FIG. 2B shows the ultrasonic actuator of FIG. 1 in a different perspective view, so that mainly the cover surface 4 can be seen here. Just as on the base 3, two identically shaped and mirror-image electrodes 7 and 7' are located on the cover surface 4, which are also spaced apart from each other by an intervening separating gap and are thus electrically insulated from each other. The two electrodes 7 and 7' of the cover surface are arranged in mirror image to the two electrodes 6 and 6' mounted on the base 3. It is conceivable to arrange more than two electrodes on the base 3 and the cover surface 4, respectively. Moreover, it is conceivable that the number of electrodes on the base differs from the number of electrodes on the cover surface; for example, two electrodes may be arranged on the base, while only one electrode is arranged on the cover surface.

The contact portions 50 and 50' represent respective surfaces of the ultrasonic actuator 1 and may be in direct contact with an element to be moved or adjusted relative to the ultrasonic actuator 1, such as an armature. However, since direct contact may lead to increased wear of the electromechanical material of the ultrasonic actuator 1, which normally has rather poor tribological properties, preferably friction elements are provided at the contact portions 50 and 50', which are optimized with respect to friction and wear properties. In the presence of friction elements arranged at the contact portions 50 and 50', there is then achieved an indirect contact between the contact portions 50 and 50' of the ultrasonic actuator and an element to be moved or adjusted relative to the ultrasonic actuator 1.

Figure 3:
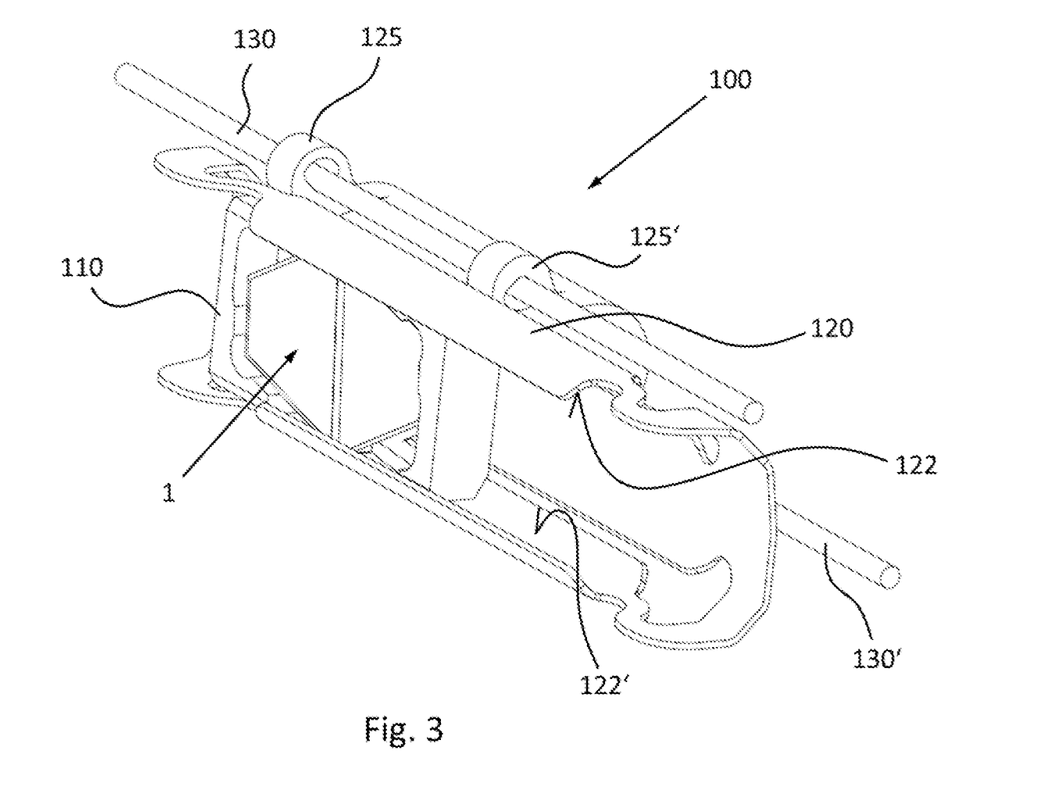
FIG. 3: Perspective view of an embodiment of a motor with an ultrasonic actuator according to FIGS. 1 and 2

FIG. 3 is a perspective view of a potential embodiment for a motor 100 realized as a linear drive with an ultrasonic actuator 1 according to FIGS. 1 and 2. Here, the ultrasonic actuator is inserted into a mounting device 110, which is itself connected to a higher-level stationary element, for example a base, in a manner not visible in FIG. 3, thereby obtaining stationary mounting of the ultrasonic actuator.

An armature 120 is arranged movably oppositely or relatively to the ultrasonic actuator in the form of a spatially structured sheet with two elongated running surfaces 122, 122' formed integrally therewith and arranged parallel to one another, which are indirectly in contact to the ultrasonic actuator via friction elements, not visible in FIG. 3, by means of the contact portions 50, 50' of the ultrasonic actuator.

Due to its the special design the armature 120 is imparted, among other things, with specific resilient properties, with which the running surfaces 122, 122'—after insertion of the mounting device 110 into the armature 120—are pressed or pressed with a defined force against the friction elements or the contact portions 50, 50'. This force ensures, on the one hand, that the ultrasonic actuator is subjected to a preload necessary for reliable and defined operation and, on the other hand—due to the geometry of the ultrasonic actuator according to the invention—that the ultrasonic actuator is subjected to a torque in a counterclockwise direction, thereby pressing it firmly against the mounting device 110, so that the ultrasonic actuator is firmly held therein.

The torque thus applied to the ultrasonic actuator elicits a clockwise counter-torque, which acts on the armature 120. Integrally designed with the armature 120 are two guide portions 125 and 125', which are spaced apart from each other and have different shapes, and two bearing portions 126 and 126', which are arranged opposite to each other and are not visible in FIG. 3. It is also conceivable to provide the guide portions 125, 125' and/or the bearing portions 126, 126' as separate components and to connect them to the armature 120, for example by means of a screw or adhesive connection.

The guide portions 125, 125' are in sliding engagement with two round rod-shaped guide elements 130, 130' made of steel and arranged parallel to each other. It is equally conceivable to use guide elements 130, 130' made of a ceramic. The guide part 124 with its guide portions, together with the guide elements 130, 130', forms a sliding guide that serves to compensate for the friction already generated by the shape of the running surfaces 122, 122' and their contact situation with the friction elements of the ultrasonic actuator to make the linear movement of the armature 120 more precise.

The counter-torque acting on the armature 120 ensures that the guide portions 125 and 125' are in defined contact with the upper guide element 130 in FIG. 3. The guide portions 125 and 125' each have an aperture through which the guide element 130 projects. The cross-section of the guide portions 125, 125' is not round, but each has a V-shaped area whose two flanks serve to support the guide element 130. While in the case of the left-hand guide portion 125 in FIG. 3 the V-shaped portion points downwards, it points upwards in the case of the right-hand guide portion 125' in FIG. 3. The counter-torque acting on the armature 120 now causes the V-shaped portions of the guide portions 125, 125' or their flanks to bear against the guide element 130 with a defined force and thus, at the same time, a defined mutual alignment takes place between the guide element 130 and the guide portions 125, 125'.

The force, with which the flanks or legs of the V-shaped portions of the guide portions 125, 125' are pressed against the guide element 130, may be influenced by the forces acting on the ultrasonic actuator 1 via the running surfaces 122, 122' of the armature 120, which forces depend primarily on the resilient properties of the sheet metal of the armature 120 and its geometries and the geometries of the ultrasonic actuator. The higher these forces and the resulting torque acting on the ultrasonic actuator, the greater the corresponding counter-torque acting on the armature. Now, the further the guide portions 125, 125' are spaced apart from each other, the lower are the contact forces of the flanks or legs of the V-shaped regions of the guide portions 125, 125' against the guide element 130 due to the increasing lever lengths. Thus, an adjustment of these contact forces may also be achieved by the spacing of the guide portions 125, 125'.

The sliding bearing or sliding guide formed in this way is easy to assemble, comparatively simple to implement and thus overall cost-effective. The contact forces may be tailored so that, in particular, low frictional resistances arise, against which the ultrasonic actuator must work. At the same time, such a sliding guide may withstand high mechanical loads and exhibits high running accuracy.

Figure 4:
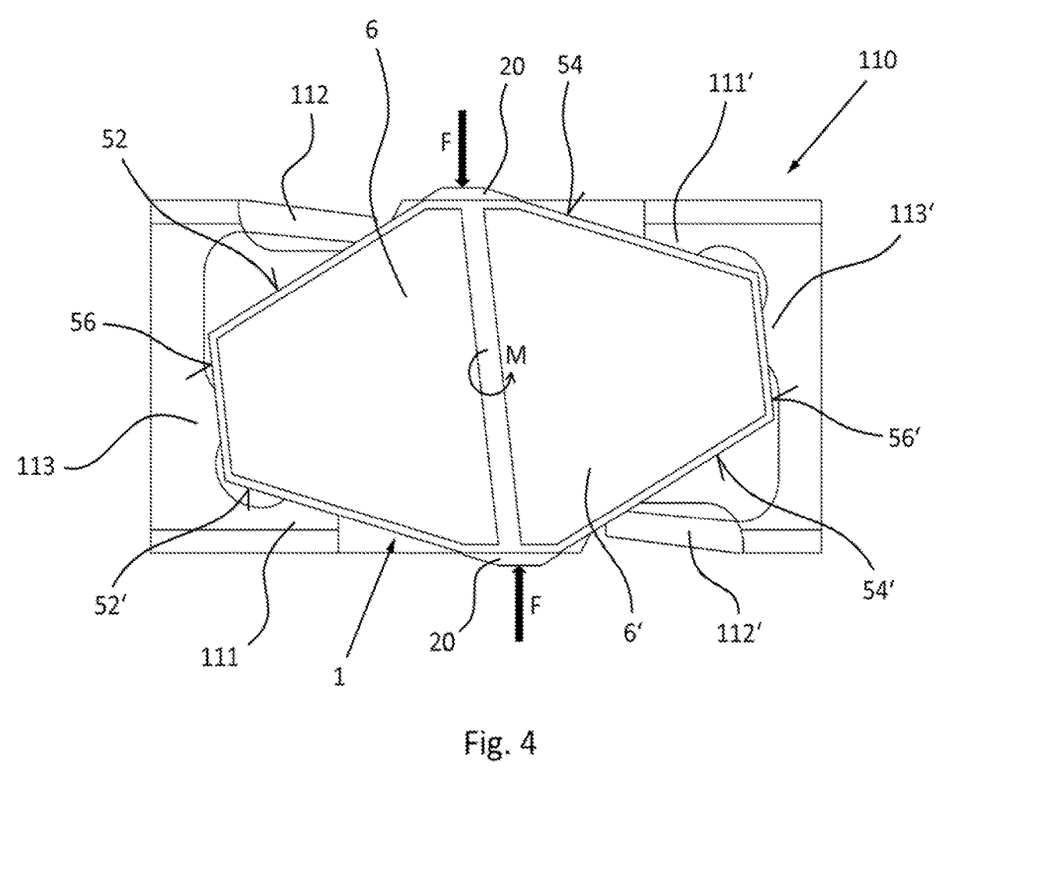
FIG. 4: Mounting device for an ultrasonic actuator of the motor according to FIG. 3

FIG. 4 shows in a separated manner and thus as a detail of the motor according to FIG. 3 only the mounting device 110 with the ultrasonic actuator 1 inserted therein according to FIGS. 1 and 2. The mounting device 110, which is made of polyetheretherketone (PEEK), has a total of six retaining portions 111, 111', 112, 112', 113, 113', which contact the ultrasonic actuator at different portions 52, 52', 54, 54', 56, 56' of its side surface 5 and thus firmly clamp or hold the ultrasonic actuator. Other materials, particularly polymeric materials, for the mounting device 110 are equally conceivable, such as polyoxymethylene (POM) or polyamide (PA).

Two of the retaining portions that contact the ultrasonic actuator at its longer side surface portions 52', 54 are designed to be mechanically less resilient and thus stiff and form correspondingly stiff retaining portions 111, 111 ', while the two other retaining portions, which likewise contact the ultrasonic actuator at longer but different side surface portions 52, 54', are mechanically resilient and thus have resilient properties and form correspondingly resilient contact portions 112, 112'. The retaining portions 113, 113' contact the ultrasonic actuator at the shorter side surface portions 56, 56' and are also of low mechanical resiliency.

The forces F acting on the two friction elements 20 from the running surfaces 122, 122' of the armature 120 are indicated in FIG. 4, as is the torque M acting therefrom on the ultrasonic actuator 1, which attempts to rotate the ultrasonic actuator counterclockwise. Due to this torque M, the side face portions 52' and 54 are pressed more strongly against the stiff contact portions 111 and 111', whereas the latter are thus supported more firmly. At the same time, the side surface portions 52 and 54' attempt to move away from the resilient contact portions 112, 112' due to the acting torque M, but their resilient properties ensure constant contact with these side surface portions 52 and 54', so that the pressing force of the resilient contact portions 112, 112' against the side surface portions 52 and 54' is independent of the acting torque M.

Figure 5:
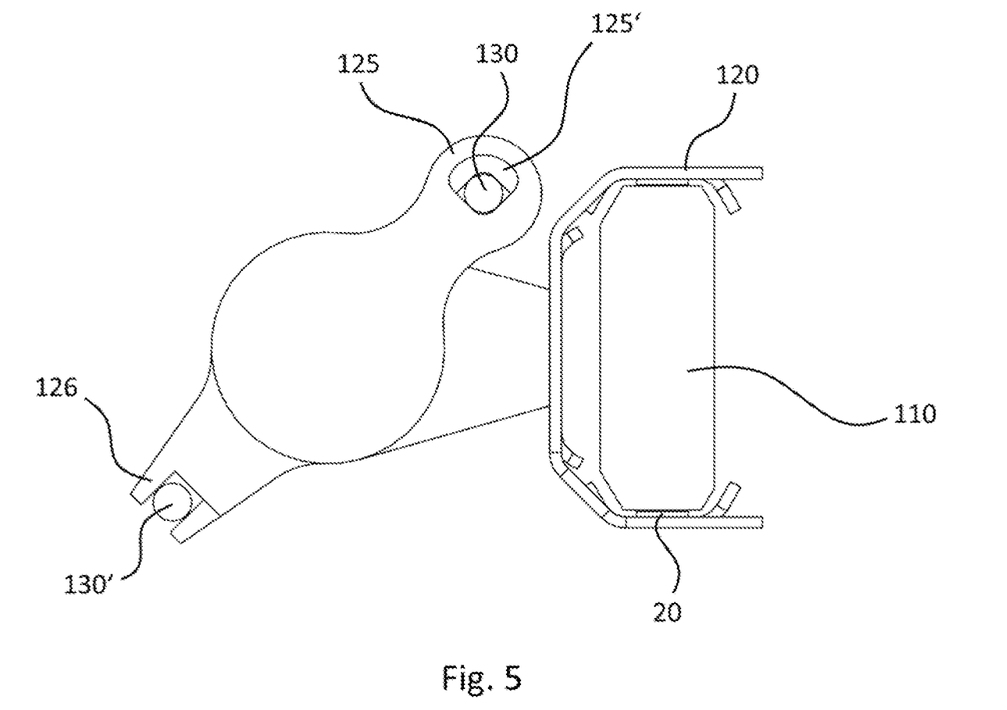
FIG. 5: Side view of the motor according to FIG. 3.

FIG. 5 shows the motor according to FIG. 3 in a side view, the viewing direction coinciding with the drive direction. Here, in particular, the cross-sectional shape of the guide portions 125, 125' and the bearing portion 126 and their engagement situation with the guide elements 130, 130' is illustrated. The forward-facing guide portion 125 in FIG. 5 has a downward-facing V-shaped portion, and the guide element 130 rests on or is supported by both flanks or legs of the V-shaped portion. The rearward-facing guide portion 125' in FIG. 5, of which only a part can be seen, has an upward-facing V-shaped portion, and the guide element 130 also rests here on both flanks or legs of this V-shaped portion. The counter-torque acting on the armature—resulting from the torque acting on the ultrasonic actuator via the armature—thus serves to press and simultaneously align the guide element 130 in the guide portions 125, 125'. Opposite the guide portions 125 and 125' there is a respective bearing portion 126, 126', of which, however, only the forward-facing bearing portion 126 is visible. This has a right-angled, groove-shaped recess, in which the guide element 130' is mounted with clearance. The bearing portion 126' has a cross-sectional geometry identical to that of the bearing portion 126. The bearing portions 126 and 126' serve to prevent rotation of the bearing part 124 of the armature 120 fixedly connected thereto about the guide element 130

Figure 6:
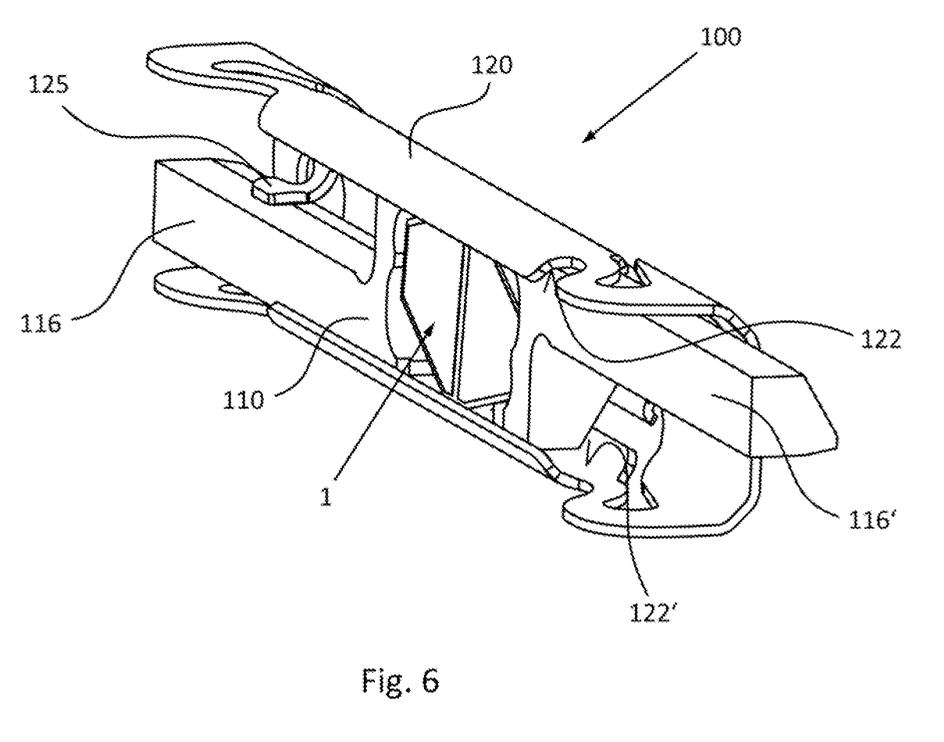
FIG. 6: Perspective view of an embodiment of a motor with the ultrasonic actuator according to FIGS. 1 and 2.

FIG. 6 is a perspective view of a further potential embodiment for a motor 100 realized as a linear drive with an ultrasonic actuator 1 according to FIGS. 1 and 2. Here, the mounting device 110, which is configured identically as in FIG. 3 or 4, includes elongated guide portions 116, 116' formed integrally therewith, against which guide portions 125, 125' in the form of a curved or angled bar formed integrally with the armature 120 in the form of a spatially structured metal sheet are supported, and of which only the guide portion 125 can be seen in FIG. 6. Taking over the function of the guide elements 130 in FIGS. 3 and 5 by guide portions 116, 116' integrally formed with the support device 110 allows a much more compact design of a motor with the ultrasonic actuator according to the invention, which has fewer components and is also easier and faster to assemble.

LIST OF REFERENCE SIGNS

1: ultrasonic actuator
2: plate
3: base (of plate 2)
4: cover surface (of plate 2)
5: side surface (of plate 2)
6, 6': electrodes
7, 7': electrodes
8, 8': sides (of base 3)
9, 9': connecting lines
10: parallelogram (inscribed in the base 3)
11: larger interior angle (of the inscribed parallelogram 10)
12, 12': trapezoid (of the base 3)
13, 13': base (of the trapezoid 12, 12')
14: diagonal (of the trapezoid 12, 12')
15: distance (between the side 16, 16' opposite to the base 13, 13' of a trapezoid 12, 12' and the base of the other trapezoid)
16, 16': side (opposite to the base 13, 13' of the trapezoid 12, 12')
20: friction element
50: contact portions (of the side surface 5)
52, 52': portions (of the side surface 5)
54, 54': portions (of side surface 5)
56, 56': portions (of side surface 5)
100: motor
110: mounting device (of the motor 100)
111, 111': stiff retaining portions (of the holding device 110)
112, 112': resilient retaining portions (of the holding device 110)
113, 113': retaining portions (of the holding device 110)
116, 116': guide portions (of the holding device 110)
120: armature
122, 122' running surfaces (of the armature 120)
125, 125': guide portions (of the armature 120)
126, 126': bearing portions (of the armature 120)
130, 130': guide elements

The invention claimed is:

1. An ultrasonic actuator comprising:
   a plate having a base, a cover surface geometrically similar to the base, and a side surface interconnecting the base and the cover surface, wherein the plate includes an electromechanical material; and
   electrodes are arranged on the base and on the cover surface opposite the base for exciting periodic deformations of the plate, wherein the base includes at least two sides that are arranged parallel to one another and form contact portions of the side surface, and the at least two sides of the base that are arranged parallel to one another, together with connecting lines that mutually connect the respective end points of the at least two sides arranged parallel to one another, form a parallelogram inscribed in the base, wherein in the inscribed parallelogram an angle other than 90° is defined between abutting sides.

2. A motor comprising:
   the ultrasonic actuator according to claim 1; and
   a mounting device for fixedly retaining the ultrasonic actuator and an armature movable relative to and in frictional contact with the ultrasonic actuator.

3. The ultrasonic actuator according to claim 1, wherein larger interior angles of the inscribed parallelogram are selected to have a value between 93° and 105° and/or between 95° and 99°.

4. The ultrasonic actuator according to claim 3, wherein the base is octagonal, and a trapezoid adjoins each side of the inscribed parallelogram, and the base of each trapezoid coincides with a respective longer side of the inscribed parallelogram.

5. A motor comprising:
the ultrasonic actuator according to claim 3; and
a mounting device for fixedly retaining the ultrasonic actuator and an armature movable relative to and in frictional contact with the ultrasonic actuator.

6. The ultrasonic actuator according to claim 1, wherein the base is octagonal, and a trapezoid adjoins each side of the inscribed parallelogram, and the base of each trapezoid coincides with a respective longer side of the inscribed parallelogram.

7. The ultrasonic actuator according to claim 6, wherein each trapezoid is an isosceles trapezoid.

8. The ultrasonic actuator according to claim 7, wherein a length of each diagonal of a trapezoid is substantially identical to a distance between a side opposite the base of this trapezoid and the base of another trapezoid.

9. A motor comprising:
the ultrasonic actuator according to claim 8; and
a mounting device for fixedly retaining the ultrasonic actuator and an armature movable relative to and in frictional contact with the ultrasonic actuator.

10. The motor according to claim 2, the armature comprises:
at least two guide portions spaced apart from one another, which are in a contact with separately provided guide elements or with guide portions of the mounting device so as to enable a sliding relative movement between the guide portions and the guide elements or the guide portions.

11. The motor according to claim 10, wherein the mounting device comprises;
at least four retaining portions contacting the ultrasonic actuator at different portions of the side surface, of which two retaining portions are mechanically rigid and form rigid retaining portions, and of which two retaining portions have resilient properties and form resilient contact portions.

12. The motor according to claim 11, wherein the rigid retaining portions and the resilient retaining portions are each arranged obliquely opposite to one another.

13. The motor according to claim 12, wherein the mounting device comprises:
two further retaining portions each contacting a portion of the side surface of the ultrasonic actuator located between an area of the side surface contacted by the respective rigid retaining portion and the respective resilient retaining portion.

14. The motor according to claim 11, wherein the mounting device comprises:
two further retaining portions each contacting a portion of the side surface of the ultrasonic actuator located between an area of the side surface contacted by the respective rigid retaining portion and the respective resilient retaining portion.

15. The motor according to claim 14, wherein the armature comprises:
two elongated and mutually parallel running surfaces which contact the ultrasonic actuator directly or indirectly at its contact portions and clamp the ultrasonic actuator between them in such a way that a torque acts on the ultrasonic actuator, by which in each case that portion of the side surface that is in contact with the rigid contact portion is pressed against the latter.

16. The motor according to claim 15, the armature comprises:
at least two guide portions spaced apart from one another, which are in a contact with separately provided guide elements or with guide portions of the mounting device so as to enable a sliding relative movement between the guide portions and the guide elements or the guide portions.

* * * * *